US008531903B1

(12) United States Patent
Ramamoorthy et al.

(10) Patent No.: US 8,531,903 B1
(45) Date of Patent: Sep. 10, 2013

(54) METHOD AND APPARATUS FOR CALIBRATING A READ/WRITE CHANNEL IN A MEMORY ARRANGEMENT

(71) Applicant: Marvell International, Ltd., Hamilton (BM)

(72) Inventors: Aditya Ramamoorthy, Ames, IA (US); Gregory Burd, San Jose, CA (US); Xueshi Yang, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/752,121

(22) Filed: Jan. 28, 2013

Related U.S. Application Data

(63) Continuation of application No. 13/099,997, filed on May 3, 2011, now Pat. No. 8,363,501, which is a continuation of application No. 12/689,891, filed on Jan. 19, 2010, now Pat. No. 7,936,630, which is a continuation of application No. 11/738,263, filed on Apr. 20, 2007, now Pat. No. 7,649,793.

(60) Provisional application No. 60/797,591, filed on May 4, 2006.

(51) Int. Cl.
*G11C 7/02* (2006.01)

(52) U.S. Cl.
USPC .............. 365/210.11; 365/210.1; 365/189.15; 365/206

(58) Field of Classification Search
USPC ...................... 365/206, 189.15, 210.11, 210.1
See application file for complete search history.

(56) References Cited

U.S. PATENT DOCUMENTS

| | | | |
|---|---|---|---|
| 5,926,413 A | 7/1999 | Yamada et al. | |
| 6,385,111 B2 | 5/2002 | Tran et al. | |
| 6,504,778 B1 | 1/2003 | Uekubo | |
| 6,590,804 B1 | 7/2003 | Perner | |
| 6,791,880 B1 | 9/2004 | Kurihara et al. | |
| 6,873,543 B2 | 3/2005 | Smith et al. | |
| 7,126,844 B2 | 10/2006 | Theel | |
| 7,649,793 B1 | 1/2010 | Ramamoorthy et al. | |
| 7,936,630 B1 * | 5/2011 | Ramamoorthy et al. | 365/210.11 |
| 8,363,501 B1 * | 1/2013 | Ramamoorthy et al. | 365/210.11 |
| 2001/0053104 A1 | 12/2001 | Tran et al. | |

* cited by examiner

*Primary Examiner* — Andrew Q Tran

(57) ABSTRACT

A memory arrangement including a memory block and a controller. The memory block comprises a plurality of memory cells, wherein each memory cell operable to store one of a plurality of different levels of charge. The controller is configured to write (i) a first reference signal threshold into a first memory cell and (ii) a second reference signal threshold into a second memory cell. The first reference signal threshold corresponds to a first level of charge of the plurality of different levels of charge, and the second reference signal threshold corresponds to a second level of charge of the plurality of different levels of charge. Each of the first level of charge and the second level of charge is used to calibrate a read back of any of the one of the plurality of different levels of charge stored among the plurality of memory cells in the memory block.

19 Claims, 5 Drawing Sheets

METHOD AND APPARATUS FOR CALIBRATING A READ/WRITE CHANNEL IN A MEMORY ARRANGEMENT

CROSS REFERENCE TO RELATED APPLICATIONS

The present disclosure is a continuation of and claims priority to U.S. patent application Ser. No. 13/099,997, filed May 3, 2011, now U.S. Pat. No. 8,363,501, issued, Jan. 29, 2013, which is a continuation of U.S. patent application Ser. No. 12/689,891, filed Jan. 19, 2010, now U.S. Pat. No. 7,936, 630, issued May 3, 2011, which is a continuation of U.S. patent application Ser. No. 11/738,263, filed Apr. 20, 2007, now U.S. Pat. No. 7,649,793, issued Jan. 19, 2010, which claims priority to U.S. Provisional Patent Application No. 60/797,591, filed on May 4, 2006, which are incorporated herein by reference.

TECHNICAL FIELD

Embodiments of the present invention relate to the field of integrated circuits, and more particularly, to channel estimation for multi-level memories using pilot signals.

BACKGROUND

In order to increase memory capacity, manufacturers have continually moved memory chip or on-chip memory (such as flash memory) production to smaller process geometries over the last few years. Recently, multi-level signal memory cells have been used to increase flash memory capacity. In such an arrangement, a cell is configured to produce distinct signal threshold levels, which results in distinct read-back levels. With four level signals available per cell, two bits may be included into each flash memory cell. One problem with writing with four signal levels into each cell is that the distinction between adjacent levels may become difficult to discern. This is often referred to in the art as reduced signal distance (often shown as reduced $D_{min}$). This may lead to a signal to noise ratio loss in the arrangement that needs to be recovered using error-control coding and signal processing.

When a multi-level data signal is obtained from a multi-level signal memory, there are various sources of noise that may corrupt the received signal and degrade the estimate of the bit value. It is critical for a signal processing or channel block to compensate for these noise effects and supply a code decoder with reliable inputs such that the net system performance is good.

SUMMARY

In accordance with various embodiments of the present invention, a memory apparatus includes a memory block comprising a plurality of memory cells and adapted to operate with at least two levels of signals for writing data into and reading data from the memory cells. At least two memory cells are employed as reference cells to output a plurality of pilot signals. The memory apparatus also includes a channel block operatively coupled to the memory block, and adapted to facilitate the writing and reading of data into and from the memory cells. The channel block is also adapted to receive the pilot signals and determine one or more disturbance parameters based at least in part on the pilot signals and to compensate read back signals based at least in part on the determined one or more disturbance parameters during said reading of data from the memory cells.

In accordance with various embodiments, the reference cells are set to at least one of the at least two levels of signals.

In accordance with various embodiments, the one or more disturbance parameters are at least one of a direct current (DC) offset, a gain offset, and mean shift and variances of additive noise.

In accordance with various embodiments, the one or more disturbance parameters are signal level dependent.

In accordance with various embodiments, the channel block is adapted to determine the one or more disturbance parameters employing a signal processing model.

In accordance with further embodiments, the signal processing model includes an additive noise component modeled to be Gaussian having an unknown mean and an unknown covariance structure.

In accordance with further embodiments, the signal processing model includes at least one system of equations with one or more unknown parameters corresponding to the one or more disturbance parameters to be determined, and the channel block is adapted to solve the at least one system of equations via at least one of maximum-likelihood solution, a minimum means square error (MMSE) solution, a regularized MMSE solution, a minimum-norm MMSE solution or a method that uses an apriori probability distribution of the one or more unknown parameters.

In accordance with various embodiments, the at least one system of equations is represented by $y=t(x)+n(x)$, wherein x represents a charge level, $n(x)$ represents an additive noise component, $t(x)$ represents an ideal read back signal, and y represents a read back value for the pilot signal.

In accordance with further embodiments, $n(x)$ includes a signal dependent mean shift, $m(x)$, for each charge level, and a signal dependent noise variance represented by $\sigma^2(x)$.

In accordance with various embodiments, the memory block is configured as a flash memory device.

In accordance with various embodiments, the memory block comprises one of a floating gate device, oxide-nitride-oxide (ONO) charge trapping device or a phase change memory device.

In accordance with various embodiments of the present invention, a method includes receiving a plurality of pilot signals output from reference cells of a memory block of a memory apparatus and determining one or more disturbance parameters based at least in part on the pilot signals. The method also includes receiving at least one signal having at least two signal levels output from the memory block and compensating the at least one signal based at least in part on the determined one or more disturbance parameters.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

For the purposes of the present invention, the phrase "A/B" means A or B. For the purposes of the present invention, the phrase "A and/or B" means "(A), (B), or (A and B)". For the purposes of the present invention, the phrase "at least one of A, B, and C" means "(A), (B), (C), (A and B), (A and C), (B and C), or (A, B and C)". For the purposes of the present invention, the phrase "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Embodiments of the present invention provide channel estimation for multi-level memories using pilot signals.

Figure 1:
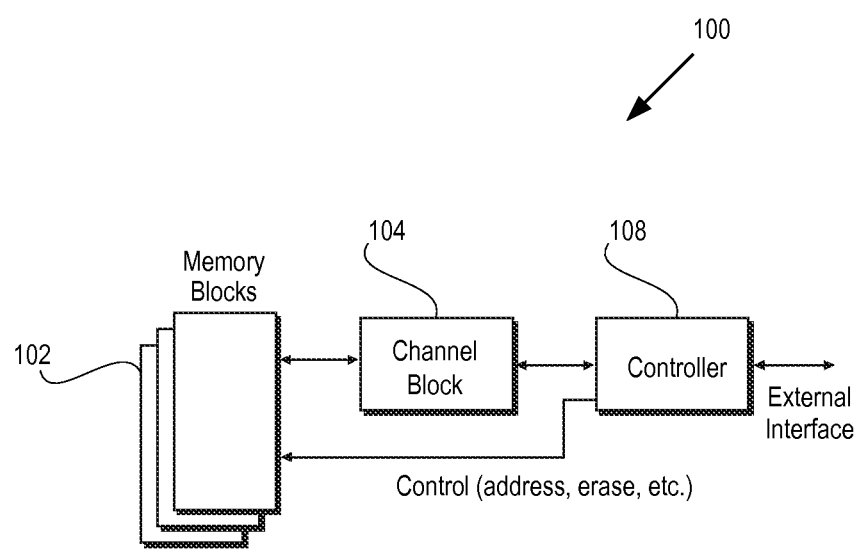
FIG. 1 schematically illustrates a memory arrangement in accordance with various embodiments of the present invention.

In general, a block diagram of a memory arrangement 100, in accordance with various embodiments of the present invention, is illustrated in FIG. 1. Memory arrangement 100 may include one or more memory blocks 102 that each includes memory cell arrays, as well as read and write circuits. Memory arrangement 100 may also include a channel block 104 that performs signal processing on the read back signals from memory block 102. In accordance with various embodiments of the present invention, analog and digital components of channel block 104 may need to be calibrated/adapted in order to provide reliable retrieval of stored data.

A controller 108 is provided to interface to external system(s) in order to receive and send data signals through its external data interface, both to and from channel block 104. Controller 108 performs various tasks including tasks that direct where data signals may be written into or read from the memory block depending upon command instructions received through its external interface. In various embodiments, memory blocks 102 may be flash memory blocks.

Figure 1A:
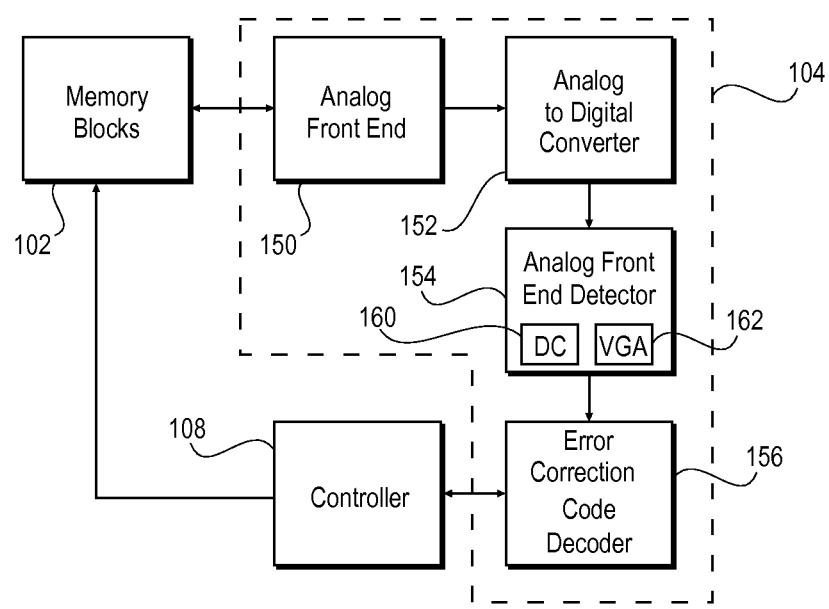
FIG. 1A schematically illustrates an exemplary channel block in accordance with various embodiments of the present invention.

With reference to FIG. 1A, in accordance with various embodiments of the present invention, channel block 104 may comprise analog front end 150, analog-to-digital converter (ADC) 152, analog front end detector 154, and outer Error Correction Code (ECC) decoder 156. An exemplary read path, in accordance with various embodiments, may flow from controller 108 to ECC decoder 156 for encoding to memory block 102, where the data may be modulated with a constellation map (not shown) and then is written to memory block 102 via a write circuit (not shown). An exemplary write path, in accordance with various embodiments, may flow from memory block 102 to analog front end 150 to ADC 152 to analog front end detector 154 to ECC decoder 156 for decoding and on to controller 108.

Figure 2:
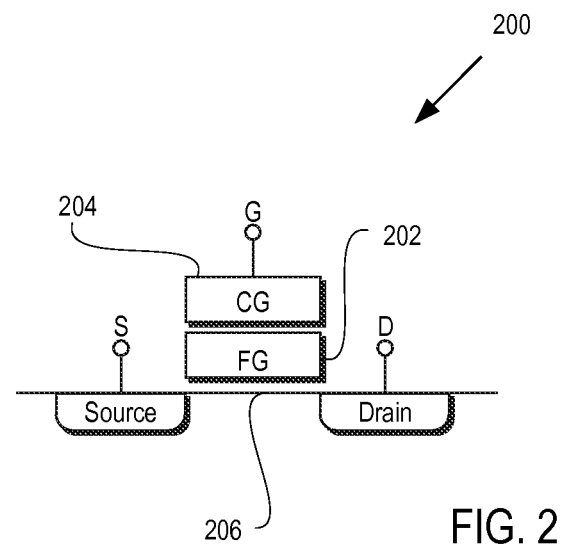
FIG. 2 schematically illustrates an exemplary transistor for a flash memory cell for use to practice various embodiments of the present invention.
Figure 3:
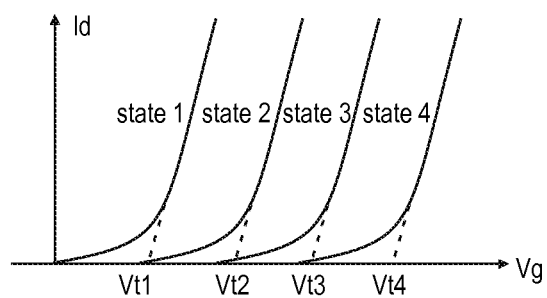
FIG. 3 is a graph illustrating transistor characteristics corresponding to different charge levels.

Generally, an exemplary flash memory cell, in accordance with various embodiments of the present invention and depicted in FIG. 2, includes an insulated gate transistor 200 that includes a floating gate 202 between the channel 204 and the control gate 206. Charge trapped in the floating gate 202 modifies the turn-on threshold voltage. The transistor characteristics are illustrated in FIG. 3, corresponding to different charge levels stored on the floating gate 202.

To optimize the usable range of ADC 152, analog front end detector 154 may include direct current (DC) compensation block 160 and variable gain amplifier (VGA) 162. DC compensation block 160 and VGA 162 may be calibrated to maximize usable range of ADC 152 output.

DC compensation block 160 and VGA 162 may be calibrated so that the output, y, of ADC 152 may be modeled as $$y=t(x)+n$$

where t(x) is ideal (noise free) ADC output corresponding to a charge of x being stored in the memory cell, and n is an additive noise term. The noise term n is in general a function of charge level x and thus, may be written as n(x).

Figure 6:
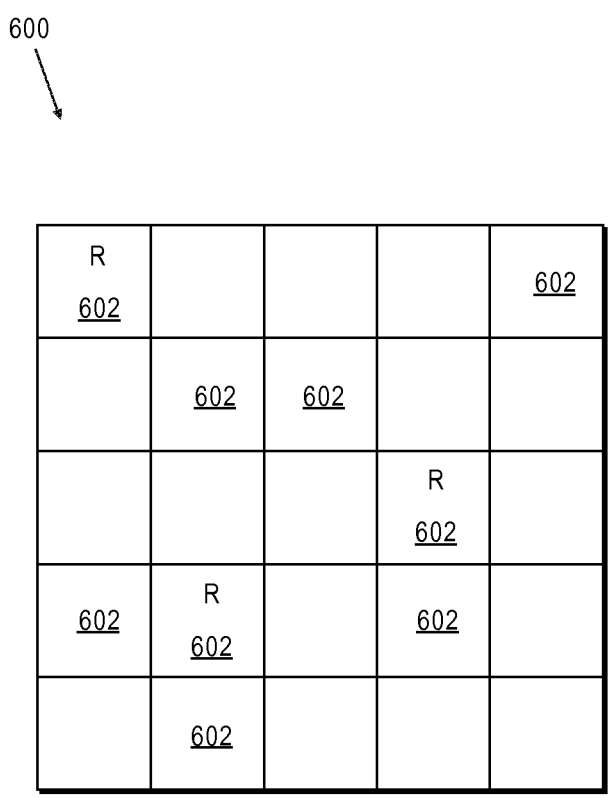
FIG. 6 schematically illustrates a memory cell array in accordance with various embodiments of the present invention.

In accordance with various embodiments of the present invention, and referring to FIG. 6, pilot cells may be used to calibrate the analog front end 150 to make sure that an entire range of ADC 152 is fully utilized. Note that as more and more levels may be written into a cell 602, it becomes impractical to have pilot cells for each possible level x that may be stored in the cell. Instead analog front end calibration may be accomplished by having reference (pilot) cells R corresponding to the smallest and largest charge that may be stored on a cell. Reference cells R corresponding to the smallest charge may be used to calibrate the DC compensation block 160, so that the read back signals from such cells corresponds to the least significant bit (LSB) of the range of ADC 152. Then the reference cells R containing the largest charge may be read and VGA 162 may be adjusted to make sure that the read back signal y from the reference cells R is close to the maximum value of the output of ADC 152.

The noise term n has a Gaussian distribution with mean m(x) and variance $\sigma^2(x)$. Note that both the mean and variance are a function of stored charge level x. With devices that include a plurality of memory cells arranged in arrays, many parameters that naturally vary from one device to another due to imperfect process control may affect the programmed threshold of the device. The net result is that if one were to write to many devices targeting a certain threshold value, the end result is a distribution of target threshold values instead of the desired distinct target threshold values.

Figure 4:
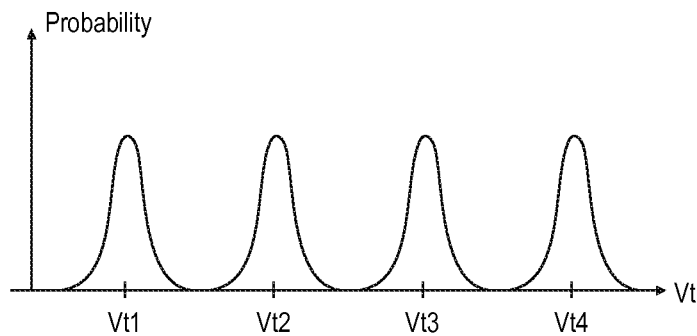
FIG. 4 is a graph illustrating a probability density distribution for the threshold voltage of a system of four charge level flash memory cells.
Figure 5:
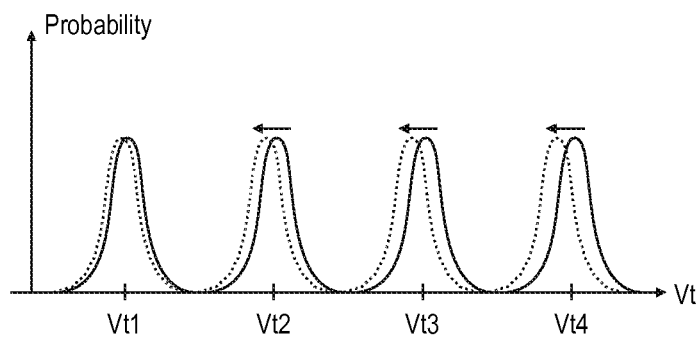
FIG. 5 is a graph illustrating the shift profile for the probability distribution for the threshold voltage of a system of four charge level flash memory cells.

FIG. 4 illustrates a typical probability density function (PDF) for the target threshold voltages of a system of flash memory cells, where each cell has, for example, four target charge levels. Over time, the charge trapped in floating gate 202 generally leaks slowly and the threshold voltage may shift back towards a lower value. While the leakage is generally slow, the specification for any commercially acceptable storage device typically requires the data to be readable even after a ten-year period. The rate of leakage of the floating gate charge is dependent upon the voltage on floating gate 202. FIG. 5 illustrates a typical shift profile for the threshold PDF over time. Furthermore, the physics of charge leakage in a memory cell is such that each signal level leaks at a different rate from the others. As such, over time, the signal levels generally will not drop at the same rate. The noise term n(x) may therefore be written \ as n(x)=m(x)+N(0,$\sigma^2$(x)), where N(0,$\sigma^2$(x)) is Gaussian mean zero distribution with variance $\sigma^2$(x). The mean shift m(x) relative to ideal target level t(x) is not known apriori, and may vary as was explained earlier herein. Both m(x) and $\sigma^2$(x) may be adapted using decision driven adaptation methods. However, these methods assume that analog front end detector 154 is able to produce reliable decisions with default values m(x)=0,$\sigma^2$(x)=1. However, the value of m(x) may be significantly different from 0, rendering output of analog front end detector 154 very unreliable and preventing decision driven techniques from being used to adapt to the correct values of m(x) and $\sigma^2$(x).

Accordingly, in accordance with various embodiments of the present invention, reference signal thresholds may be written into reference cells as pilot signals, with some or all of the possible signal levels within the memory block 102. Such reference cells may effectively help to calibrate analog front end 150 and analog front end detector 154 in order to enable reliable read back of stored data. As noted, the pilot signals may be written into specially allocated cells that serve as reference cells. FIG. 6 schematically illustrates a memory cell array 600 that includes a plurality of memory cells 602. One or more cells may be allocated as reference cells R, in accordance with various embodiments of the present invention.

Channel block 104 may analyze the pilot signals output from the reference cells and estimate signal dependent mean shift, m(x), for each level, and noise variance=$\sigma^2$(x). These disturbance parameters may be determined by employing a signal processing model.

For example, consider a four level cell capable of storing 2 bits. A write circuit maps each of the possible four bit combinations (00, 01, 10, 11) to a particular charge level ($x_{00}$, $x_{01}$, $x_{10}$, $x_{11}$) stored in a memory cell. The ideal read back signals are t($x_{00}$), t($x_{01}$), t($x_{10}$), and t($x_{11}$). However, due to distortions in the read back signal, one has $$y(x_{00})-t(x_{00})=m(x_{00})+N(0,\sigma^2(x_{00}))$$

$$y(x_{01})-t(x_{01})=m(x_{01})+N(0,\sigma^2(x_{01}))$$

$$y(x_{10})-t(x_{10})=m(x_{10})+N(0,\sigma^2(x_{10}))$$

$$y(x_{11})-t(x_{11})=m(x_{11})+N(0,\sigma^2(x_{11}))$$

Note that in the above expression, the received read back signal y is also indexed by the charge level x. This is done to emphasize that analog front end detector 154 is aware of the charge level written on each reference cell.

The piloting procedure introduces known pilot signals at pre-specified locations known to channel block 104, i.e., reference cells R. Channel block 104 may then use received values from those locations and form a system of equations with unknowns m(x) and $\sigma^2$(x). In accordance with various embodiments of the present invention, the minimum means square error (MMSE) criterion is used to solve for m(x) and $\sigma^2$(x), for all values of x. In accordance with other embodiments, the maximum likelihood (ML) principle may be used to solve for m(x) and $\sigma^2$(x).

Occasionally, in accordance with various embodiments, the system of equations may be specified by a matrix that is not full-rank. In such a scenario, a variety of techniques may be used such as, for example, regularized MMSE and minimum-norm MMSE. Alternatively, information about the apriori probability distribution of the parameters may be used.

Thus, in accordance with various embodiments of the present invention, disturbance parameters with regard to read back signals from memory may be determined and compensated for. In essence, the gain offset may be compensated via gain adjustment of VGA 162 (via a feed-forward or feedback method); the DC offset may be compensated via DC level adjustment along the signal path at DC compensation block 160; while the noise mean and variance offset may be compensated by adapting the signal detection algorithm applied via analog front end detector 154.

In accordance with various embodiments of the present invention, channel block 104 may also include a sample data buffer capable of storing a large section of data samples so iterative or over-a-block processing may be performed (e.g., block averaging for gain control so that signal levels may become normalized before other processing by the channel block).

In accordance with various embodiments of the present invention, at least memory block 102, and even the entire memory arrangement 100, is a flash-type memory device. For clarity, the present invention has been described as such, although those skilled in the art will understand that other types of memory may benefit from the present invention. Additionally, in accordance with various embodiments of the present invention, the present invention is useful for many types of memory devices such as, for example and not limited to, floating gate devices, oxide-nitride-oxide (ONO) charge trapping devices, and phase change memory devices.

While the present invention is useful for all types of devices that use memory, it is especially useful for portable electronic devices, such as, for example, mobile phones, laptop computers, personal digital assistants, gaming devices, music players, and video players. In various embodiments, the portable electronic devices may include reduced instruction set (RISC) processors and wireless communication support, such as wireless communication in accordance with one or more of the Institute of Electrical and Electronic Engineer's (IEEE) 802.11 family of standards.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. A memory apparatus comprising:
   a memory block comprising (i) a plurality of memory cells and (ii) a plurality of pilot cells, wherein each of the plurality of memory cells and each of the plurality of pilot cells is configured to store at least two bits of corresponding data; and
   a channel block coupled to the memory block, wherein the at least two bits of data stored in each of the plurality of pilot cells is known to the channel block, and wherein the channel block is configured to
  receive, from each pilot cell of the plurality of pilot cells, a corresponding pilot signal that is based on the at least two bits of data stored in the pilot cell, such that a plurality of pilot signals are respectively received from the plurality of pilot cells, and
  calibrate a parameter based on the plurality of pilot signals, wherein the parameter, as calibrated by the channel block, is usable by the channel block to read the at least two bits of data stored in one or more of the plurality of memory cells.

2. The memory apparatus of claim 1, wherein the parameter, as calibrated by the channel block, is further usable by the channel block to write at least two bits of data to one or more of the plurality of memory cells.

3. The memory apparatus of claim 1, wherein:
  a first pilot cell of the plurality of pilot cells is configured to store at least two bits of data corresponding to a first value;
  a second pilot cell of the plurality of pilot cells is configured to store at least two bits of data corresponding to a second value; and
  the first value is different from the second value.

4. The memory apparatus of claim 3, wherein:
  the first value is 00; and
  the second value is 11.

5. The memory apparatus of claim 3, wherein:
  the first value corresponds to a smallest possible value of the at least two bits of data; and
  the second value corresponds to a largest possible value of the at least two bits of data.

6. The memory apparatus of claim 5, wherein the parameter is a first parameter, and wherein the channel block is further configured to
  based on receiving a first pilot signal from the first pilot cell, calibrate the first parameter, wherein the first pilot signal is based on the at least two bits of data corresponding to the first value; and
  based on receiving a second pilot signal from the second pilot cell, calibrate a second parameter, wherein the second pilot signal is based on the at least two bits of data corresponding to the second value.

7. The memory apparatus of claim 6, wherein:
  the channel block comprises an analog front end detector configured to detect an analog data signal from a memory cell of the plurality of memory cells;
  the analog front end detector comprises a DC compensation block and a variable gain amplifier;
  the first parameter is used by the DC compensation block; and
  the second parameter is used by the variable gain amplifier.

8. The memory apparatus of claim 1, wherein the parameter comprises one of (i) a direct current (DC) offset, (ii) a gain offset, or (iii) mean shift and variances of additive noise.

9. The memory apparatus of claim 1, wherein the channel block comprises:
  an analog front end detector configured to detect an analog data signal from a memory cell of the plurality of memory cells; and
  an analog to digital converter to convert the analog data signal into a corresponding digital data signal.

10. The memory apparatus of claim 9, wherein the parameter is used by the analog front end detector to detect the analog data signal from the memory cell of the plurality of memory cells.

11. The memory apparatus of claim 1, wherein the memory block is configured as a flash memory device.

12. The memory apparatus of claim 1, wherein each of the plurality of memory cells comprises one of (i) a floating gate device, (ii) an oxide-nitride-oxide (ONO) charge trapping device, or (iii) a phase change memory device.

13. A method comprising:
  receiving, by a channel block from each pilot cell of a plurality of pilot cells of a memory block, a corresponding pilot signal, such that a plurality of pilot signals are respectively received from the plurality of pilot cells, wherein the memory block comprises (i) a plurality of memory cells and (ii) the plurality of pilot cells, wherein each of the plurality of memory cells and each of the plurality of pilot cells is configured to store at least two bits of corresponding data, wherein the at least two bits of data stored in each of the plurality of pilot cells is known to the channel block, and wherein the pilot signals are respectively based on the at least two bits of data stored in the plurality of pilot cells;
  based on the plurality of pilot signals, calibrating a parameter; and
  based on the parameter as calibrated, reading the at least two bits of data stored in one or more of the plurality of memory cells.

14. The method of claim 13, further comprising:
  based the parameter as calibrated, writing at least two bits of data to one or more of the plurality of memory cells.

15. The method of claim 13, wherein:
  a first pilot cell of the plurality of pilot cells is configured to store at least two bits of data corresponding to a first value;
  a second pilot cell of the plurality of pilot cells is configured to store at least two bits of data corresponding to a second value; and
  the first value is different from the second value.

16. The method of claim 15, wherein:
  the first value corresponds to a smallest possible value of the at least two bits of data; and
  the second value corresponds to a largest possible value of the at least two bits of data.

17. The method of claim 13, wherein the parameter comprises one of (i) a direct current (DC) offset, (ii) a gain offset, (iii) or mean shift and variances of additive noise.

18. The method of claim 13, wherein reading the at least two bits of data stored in one or more of the plurality of memory cells comprises:
  based on the parameter as calibrated,
    detecting an analog data signal from a first memory cell of the one or more of the plurality of memory cells, wherein the analog data signal is based on the at least two bits of data stored in the first memory cell, and
    converting the analog data signal into a corresponding digital data signal.

19. The method of claim 13, wherein the memory block is configured as a flash memory device.

* * * * *